United States Patent
Zang et al.

(10) Patent No.: US 11,031,167 B2
(45) Date of Patent: Jun. 8, 2021

(54) GIANT PERPENDICULAR MAGNETIC ANISOTROPY IN FE/GAN THIN FILMS FOR DATA STORAGE AND MEMORY DEVICES

(71) Applicant: University of New Hampshire, Durham, NH (US)

(72) Inventors: Jiadong Zang, Exeter, NH (US); Jiexiang Yu, Dover, NH (US)

(73) Assignee: UNIVERSITY OF NEW HAMPSHIRE, Durham, NH (US)

( * ) Notice: Subject to any disclaimer, the term of this patent is extended or adjusted under 35 U.S.C. 154(b) by 0 days.

(21) Appl. No.: 16/193,929

(22) Filed: Nov. 16, 2018

(65) Prior Publication Data
US 2019/0156983 A1  May 23, 2019

Related U.S. Application Data

(60) Provisional application No. 62/589,399, filed on Nov. 21, 2017.

(51) Int. Cl.
*H01F 10/32* (2006.01)
*G11C 11/16* (2006.01)
(Continued)

(52) U.S. Cl.
CPC ........ *H01F 10/3286* (2013.01); *G11C 11/161* (2013.01); *H01F 10/14* (2013.01);
(Continued)

(58) Field of Classification Search
CPC ...... H01F 10/3286; H01F 10/30; H01F 10/14; H01F 10/28; G11C 11/161; H01L 43/10;
(Continued)

(56) References Cited

U.S. PATENT DOCUMENTS 6,088,196 A * 7/2000 Tadokoro ............. G11B 5/3967
360/327.22
7,728,348 B2 * 6/2010 Kasai ..................... H01L 22/26
257/103
(Continued)

FOREIGN PATENT DOCUMENTS

JP          62164868 A  *  7/1987

OTHER PUBLICATIONS

Chappert, C., et al., "The emergence of spin electronics in data storage," Nat. Mater. 6, 813 (2007).
(Continued)

*Primary Examiner* — Sultana Begum
(74) *Attorney, Agent, or Firm* — Hamilton, Brook, Smith & Reynolds, P.C.

(57) ABSTRACT

A giant perpendicular magnetic anisotropy (PMA) material comprises a III-V nitride substrate, and a layer of nitrogen disposed upon a surface of the III-V nitride substrate. The layer of nitrogen forms an N-terminated surface. The PMA material further comprises an iron film disposed upon the N-terminated surface. The III-V nitride substrate may be gallium nitride (GaN). A memory device using the PMA material may further comprise an input/output interface configured to communicate an address signal, a read/write signal and a data signal. The memory device may further comprise a controller configured to coordinate reading data from and writing data to the memory element.

20 Claims, 4 Drawing Sheets

(51) Int. Cl.
| | |
|---|---|
| H01F 10/30 | (2006.01) |
| H01L 43/10 | (2006.01) |
| H01L 43/12 | (2006.01) |
| H01L 43/02 | (2006.01) |
| H01F 10/28 | (2006.01) |
| H01F 10/14 | (2006.01) |
| H01L 21/02 | (2006.01) |
| G01N 29/02 | (2006.01) |

(52) U.S. Cl.
CPC .............. *H01F 10/28* (2013.01); *H01F 10/30* (2013.01); *H01L 21/02* (2013.01); *H01L 43/02* (2013.01); *H01L 43/10* (2013.01); *H01L 43/12* (2013.01); *G01N 29/022* (2013.01)

(58) Field of Classification Search
CPC ......... H01L 43/12; H01L 43/02; H01L 21/02; G01N 29/12
See application file for complete search history.

(56) References Cited

U.S. PATENT DOCUMENTS

| | | | | |
|---|---|---|---|---|
| 9,917,004 | B2* | 3/2018 | Ishibashi | H01L 21/02389 |
| 2005/0104162 | A1* | 5/2005 | Xu | H01L 29/2003 257/627 |
| 2011/0143447 | A1* | 6/2011 | Serban | G01N 29/022 436/117 |
| 2012/0061663 | A1* | 3/2012 | Yamazaki | H01L 21/02488 257/43 |
| 2014/0145147 | A1* | 5/2014 | Kobayashi | H01L 33/32 257/22 |
| 2017/0243680 | A1* | 8/2017 | Wang | H01F 10/147 |

OTHER PUBLICATIONS

Brataas, A., et al. "Current-induced torques in magnetic materials," Nat. Mater. 11, 372 (2012).
Dieny, B., et al. ,"Perpendicular magnetic anisotropy at transition metal/oxide interfaces and applications," Reviews of Modern Physics 89, 025008, (2017).
Khajetoorians, A.A., et al., "Hitting the limit of magnetic anisotropy", Science, vol. 344, 6187, pp. 976-977, May 30, 2014.
Tang, W., et al., "A grid-based Bader analysis algorithm without lattice bias", J. Phys.: Condens. Matter 21, 84204 (2009).
Nazoki, T., et al., "Voltage-induced perpendicular magnetic anisotropy change in magnetic tunnel junctions", Applied Physics Letters, vol. 96, 022506 (2010).
Niranjan, M., et al., "Electric field effect on magnetization at the Fe/MgO(001) interface", Applied Physics Letters, vol. 96, Issue 22, 222504 May 2010.
Koziol-Rachwal, A., et al., "Tunable magnetic properties of monoatomic metal-oxide Fe/MgO multilayers", Physical Review B 90, 045428, Jul. 29, 2014.
Endo, M., et al., "Electric-field effects on thickness dependent magnetic anisotropy of sputtered MgO/Co40Fe40B20/Tastructures", Applied Physics Letters, vol. 96, Issue 21, Apr. 2010.

Yang, B.S., et al, "Strain induced enhancement of perpendicular magnetic anisotropy in Co/graphene and Co/BN heterostructures", Physical Review B 95, 174424, May 17, 2017.
Blume, et al., "Theory of spin-orbit coupling in atoms" Proceedings of the Royal Society of London A: Mathematical, Physical and Engineering Sciences 270, 127 (1962).
Blonski, P., et al., "Magnetocrystalline anisotropy energy of Co and Fe adatoms on the (111) surfaces of Pd and Rh", Physical Review B 81, 104426, Mar. 30, 2010.
Hu, J., et al., "Giant Magnetic Anisotropy of Transition-Metal Dimers on Defected Graphene", Nano Lett, 14:4, 1853-1858 (2014).
Kresse, G., et al, "From ultrasoft pseudoptentials to the projector augmented-wave method", Phys. Rev. B 59, 1758 (1999).
Henkelman, G., et al. "A fast and robust algorithm for Bader decomposition of charge density", Comput. Mater. Sci. 36, 354 (2006).
Blochl, P.E., "Projector augmented-wave method" Phs. Rev. B, vol. 50, No. 29, Dec. 15, 1994.
Wang, D., et al., "First-principles theory of surface magnetocrystalline anisotropy and the diamotmic-pair model" Phys. Rev. B 47, 14932 (1993).
Miron, I.M., et al., "Perpendicular switching of a single ferromagnetic layer induced by in-plane current injection", Nature, Nature Publishing Group, 2011, 476 (7539), pp. 189-193., Nature 476, 189 (2011).
Liu, L,, et al., "Spin torque switching with the giant spin Hall effect of tantalum", Science 336, 555 (2012).
Liu, L., et al., "Magnetic switching by spin torque from the spin Hall effect", Phys. Rev. Lett. 109, 096602 (2012).
Rau, I.G., "Reaching the magnetic anisotropy limit of a 3d metal atom" Science 344, 988 (2014).
Ou, X., et al. "Giant magnetic anisotropy of Co, Ru, and Os adatoms on MgO (001) surface", Phys. Rev. Lett. 115, 257201 (2015).
Maruyama, T., et al., "Large voltage-induced magnetic anisotropy change in a few atomic layers of iron" Nat. Nano. 4, 158 (2009).
Ibrahim, F., et al. "Anatomy of electric field control of perpendicular magnetic anisotropy at Fe/MgO interfaces", Physical Review B : Condensed matter and materials physics, American Physical Society, 2016, 93 (1), pp. 014429.
Ikeda, S., et al., "A prependicular-anisotropy CoFeB-MgO magnetic tunnel junction", Nat. Mater. 9, 721 (2010).
Worledge, D.C., et al., "Spin torque switching of perpendicular TaCoFeBMgO-based magnetic tunnel junctions", Appl. Phys. Lett. 98, 022501 (2011).
Liu, T., et al. ",Thermally robust Mo/CoFeB/MgO trilayers with strong perpendicular magnetic anisotropy", Sci. Rep. 4, 5895 (2014).
Donati, F., et al. "Magnetic Moment and Anisotropy of Individual Co Atoms on Graphene", Q. DPhys. Rev. Lett. 111, 236801 (2013).
Kresse, G., et al., "Efficient iterative schemes for ab initio total-energy calculations using a plane-wave basis set", Comput. Mater. Sci. 6, 15 (1996); Phys. Rev. B 54, 11169 (1996).
Dudarev, S.L., et al. "Electron-energy-loss spectra and the structural stability of nickel oxide: An LSDA1U study", Phys. Rev. B 57, 1505 (1998).
Sanville, E., et al. "Improved Grid-Based Algorithm for Bader Charge Allocation" , J. Phys.: Condens. Matter 21, 84204 (2009).
Jiang, W., et al. "Skyrmions in Magnetic Multilayers", Phys. Rep. 704, 1 (2017).
Perdew, J.P, et al., "JGeneralized Gradient Approximation Made Simple", Phys. Rev. Lett. 77, 3865 (1996).

\* cited by examiner

GIANT PERPENDICULAR MAGNETIC ANISOTROPY IN FE/GAN THIN FILMS FOR DATA STORAGE AND MEMORY DEVICES

RELATED APPLICATION

This application claims the benefit of U.S. Provisional Application No. 62/589,399, filed on Nov. 21, 2017. The entire teachings of the above application are incorporated herein by reference.

BACKGROUND

Perpendicular magnetic anisotropy (PMA) in magnetic thin films has become a key driving force in the development of magnetic random-access memory (MRAM) devices and other information storage devices. Establishing of PMA in nanostructures and nanopatterned magnetic multilayers paves a new avenue of nano-magnetism, in which fascinating physics such as spin Hall switching and skyrmions are blooming.

Strong PMA enables a reduction in the size of magnetic logical domains, which facilitates increasingly high storage density in data storage devices. Logical bits in the atomic scale, considered as an ideal limit of the magnetic domain size, have also been raised as huge uniaxial magnetic anisotropy was found recently when single magnetic adatoms deposited on MgO (001). But magnetic anisotropy of about 100 meV, as is currently considered a maximum limit on a single atom, is still unable to approach the stability of written information against the thermal fluctuations which has the energy scale of $45K_BT$, about 1.2 eV when temperature T is chosen as 300 K for a 10-year retention.

SUMMARY

The described embodiments of the invention are directed to the design and production of magnetic thin films with giant PMA, which is required for next generation data storage devices, for example spin transfer torque-MRAM. As used herein, the term "giant PMA" is used to describe a PMA that is more than one order of magnitude larger than the PMA associated with a Fe/MgO substrate.

As set forth in the described embodiments, such giant PMA may be achieved by growing Fe ultrathin films on top of nitrogen terminated (N-terminated) surface, i.e., a surface terminated by a thin layer of nitrogen. In the example embodiments described herein, the N-terminated surface may be grown upon a wurtzite GaN (000$\bar{1}$) surface, GaN being known in the art as a III-V nitride material. Alternative embodiments may comprise an N-terminated surface grown on one of the other III-V nitride materials known in the art (e.g., boron nitride (BN), aluminum nitride (AlN), indium nitride (InN), thallium nitride (TlN)).

In one aspect, the invention is a giant perpendicular magnetic anisotropy (PMA) material, comprising a III-V nitride substrate, and a layer of nitrogen disposed upon a surface of the III-V nitride substrate. The layer of nitrogen may form an N-terminated surface. The PMA material further comprises an iron film disposed upon the N-terminated surface.

The III-V nitride may be gallium nitride (GaN). The layer of nitrogen may be a monolayer of nitrogen atoms. The iron film may be less than or equal to three monolayers of iron atoms.

In another aspect, the invention is method of fabricating a giant PMA material, comprising exposing a surface of a III-V nitride substrate to one of (i) an atmosphere of nitrogen and (ii) an atmosphere of $NH_3$, to form an N-terminated surface, and disposing an iron film upon the N-terminated surface.

In another aspect, the invention is a memory device comprising a memory element, an input/output interface, and a controller. The memory element may comprise a III-V nitride substrate, and a layer of nitrogen disposed upon a surface of the III-V nitride substrate. The layer of nitrogen may form an N-terminated surface. The memory element may further comprise an iron film disposed upon the N-terminated surface. The input/output interface may be configured to communicate an address signal, a read/write signal and a data signal. The controller may be configured to coordinate reading data from and writing data to the memory element.

In one aspect, the invention may be a giant perpendicular magnetic anisotropy (PMA) material, comprising a III-V nitride substrate, and a layer of nitrogen disposed upon a surface of the III-V nitride substrate. The layer of nitrogen forming a nitrogen terminated (N-terminated) surface. The PMA material may further comprise an iron film disposed upon the N-terminated surface. The III-V nitride may be gallium nitride (GaN). The layer of nitrogen may be a wurtzite GaN (000$\bar{1}$) N-terminated surface. The layer of nitrogen may be a monolayer of nitrogen atoms. The iron film is less than or equal to three monolayers of iron atoms.

In another aspect, the invention may be a method of fabricating a giant PMA material, comprising exposing a surface of a III-V nitride substrate to an atmosphere configured to provide a source of nitrogen, to dispose a layer of nitrogen on the surface of the III-V nitride substrate. The layer of nitrogen may form an N-terminated surface. The method may further comprise disposing an iron film upon the N-terminated surface. The atmosphere may be configured to provide a source of nitrogen comprises an atmosphere of nitrogen.

The atmosphere may be configured to provide a source of nitrogen comprises an atmosphere of excessive NH3. The method may further comprise sample annealing the III-V nitride substrate in the atmosphere of excessive NH3. The method may further comprise heating III-V nitride substrate to a temperature substantially equal to 1000° C., while exposing the III-V nitride substrate to a nitrogen plasma. The method may further comprise reducing the III-V nitride substrate to a temperature substantially equal to 685° C., thereby initiating growth of the N-terminated surface.

In another aspect, the invention may be a memory device, comprising a memory element. The memory element may comprise a III-V nitride substrate, a layer of nitrogen disposed upon a surface of the III-V nitride substrate. The layer of nitrogen may form an N-terminated surface. The memory element may further comprise an iron film disposed upon the N-terminated surface, an input/output interface configured to communicate an address signal, a read/write signal and a data signal. The memory element may further comprise a controller configured to coordinate reading data from and writing data to the memory element.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

PMA is originated from the spin-orbit coupling (SOC), where the orbital angular momentum L is coupled with the spin momentum S according to the spin-orbit Hamiltonian $H_{SO}=\lambda L \cdot S$. The strength of the PMA is exactly the energy correction from the SOC perturbation. As all five d-orbitals, xy, yz, xz, $x^2-y^2$, and $3z^2-r^2$, in the ligand field theory have zero $L_z$ due to the time reversal symmetry, the first order perturbation of SOC vanishes if these orbitals are nondegenerate. The dominant contribution thus comes from the second order perturbation, which is the scenario in most thin film systems. The energy scale of PMA is thus $\lambda^2/\Delta$ with $\Delta$ designating the band width of states crossing the Fermi level. For a typical 3d magnetic element, $\lambda \sim 0.03$ eV and $\Delta \sim 1$ eV, PMA is only on the scale of 1 meV, which is consistent with numerous experimental and theoretical studies on well-known PMA systems such as a Fe(Co)/MgO-based system and a CoFeB/MgO-based system.

A regime where the first order perturbation of SOC is dominant would escalate the PMA, such that the PMA will be proportional to $\lambda$ instead. Such a regime may occur for partially filled degenerate orbitals around the Fermi surface. This scenario is known to take place when single adatoms or dimers are deposited on particular substrates. However, once a thin film is formed, PMA in these systems are greatly reduced.

Figure 1A:
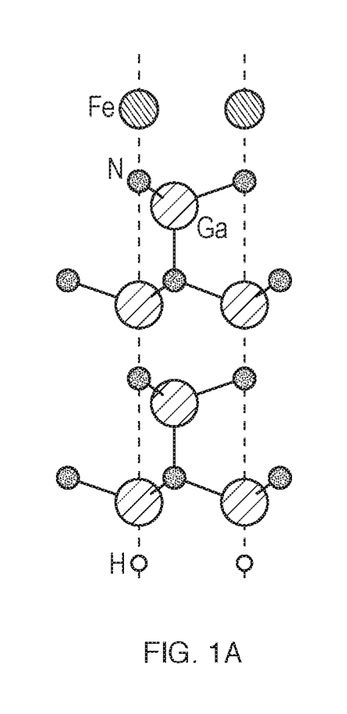
FIG. 1A shows a physical structure of a Fe/GaN thin film, according to the invention.
Figure 1B:
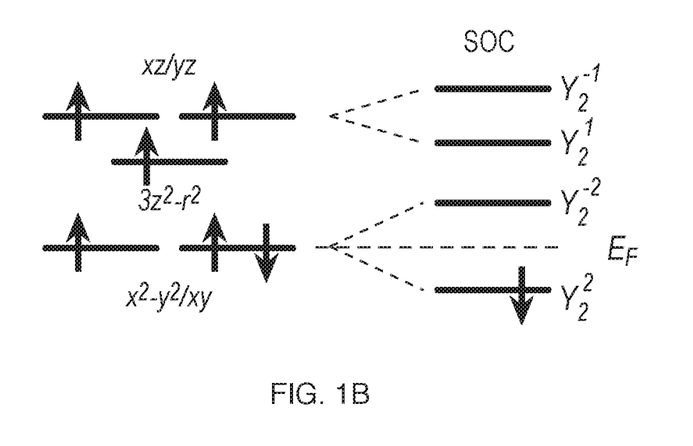
FIG. 1B illustrates energy levels of Fe(3d) orbitals.
Figure 1C:
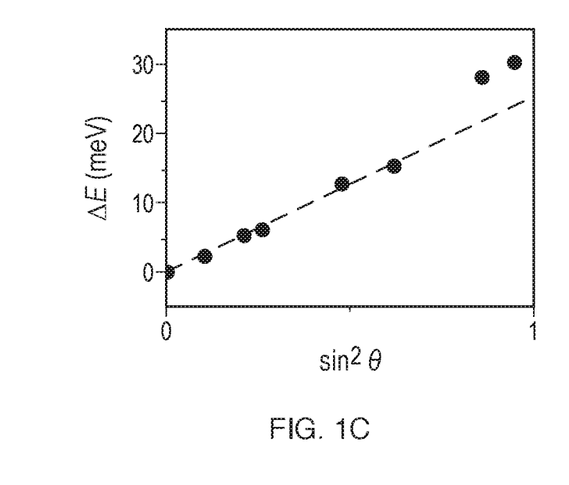
FIG. 1C illustrates the relative total energy per unit cell as a function of $\sin^2 \theta$, where $\theta$ denotes the angle between magnetization orientation and the z direction.

As set forth in the example embodiments herein, giant PMA approaching the atomic limit may occur in Fe ultrathin films grown on top of wurtzite GaN (000$\bar{1}$) nitrogen terminated (N-terminated) surface. First order perturbation of SOC is the mechanism behind the resulting giant PMA. FIG. 1A, which provides a physical picture of this mechanism, illustrates the structure of Fe/GaN thin film. The surface slab supercell of one mono-layer (ML) Fe absorption on GaN (000$\bar{1}$) N-terminated substrate used for first-principles calculations. Each Fe element experiences a crystal field respecting $C_{3v}$ point group induced by the GaN substrate. The energy levels of Fe(3d) orbitals are shown in FIG. 1B, which shows a crystal field diagram for Fe(3d)'s high spin state and its splitting by SOC. $E_F$ refers to the Fermi level in spin minority. The degenerate $x^2-y^2$ and xy, which are partially filled in spin-minority, can be lifted by SOC and transform into $Y_2^2$ and $Y_2^{-2}$. The resulting giant PMA comes from the large orbital angular momentum $L_z$=2 of the occupied $Y_2^2$ state. FIG. 1C shows the relative total energy per unit cell (u.c.) as a function of $\sin^2 \theta$, where $\theta$ denotes the angle between magnetization orientation and the z direction.

The above-described calculations were carried out in the framework of the non-collinear spin-polarized first-principles calculations with the projector augmented wave (PAW) pseudopotential implemented in the Vienna ab initio simulation package (VASP). Employed were the generalized gradient approximation (GGA) of Perdew, Burke-Ernzerhof (PBE) formation plus Hubbard U (GGA+U) with U=4.0 eV for Fe(3d) orbitals.

To build the slab supercell, four Ga—N principal layers are used as the substrate, and one to three Fe monolayers (MLs) are deposited on the N-terminated (000$\bar{1}$) surface. Dangling bonds of Ga-terminated (0001) surface on the other side of the substrate are saturated by pseudo-hydrogen atoms. Vacuum layers in the supercells are more than 14 Å thick and the lattice constant in the plane is fixed to be 3.183 Å, determined from the generalized gradient approximation-Perdew, Burke and Ernzerhof (GGA-PBE) result of the wurtzite GaN. For simplicity, positions of Ga and N atoms are borrowed from their bulk values. Positions of Fe atoms are optimized under collinear magnetic calculations without SOC until the force on each Fe atom is less than 1 meV/Å. It is confirmed that N-top are the lowest energy positions of Fe atoms, as shown in FIG. 1A.

Charge density of the SOC-free ground state was used as the initial state. Self-consistent total energy calculations were employed to derive the non-collinear calculation with SOC included. Γ-centered 25×25×1 K-point meshes in the two-dimensional Brillouin zone were used with an energy cutoff of 600 eV for the plane-wave expansion. The accuracy of the total energy is thus guaranteed to be better than 0.1 meV per unit cell (u.c.).

As a central result of this work, energies of different magnetization orientations of 1 ML Fe on GaN were obtained. Spin moment, mainly attributed to the Fe(3d) electrons, is 3.84 $\mu_B$ from self-consistent calculations. The relative total energy as a function of $\sin^2 \theta$ is shown in FIG. 1C, where $\theta$ is the angle between the magnetization and z direction. Uniaxial anisotropy along the z direction is clearly identified as the lowest energy lies at $\theta$=0. Near the perpendicular magnetization ($\theta$=0) region, the energy fits well to $K_u \sin^2\theta$ with $K_u$=25.5 meV, consistent with the conventional expression of the uniaxial anisotropy. However, near the inplane magnetization region, the total energy slightly deviates from $K_u \sin^2\theta$ by about 6.2 meV. As a result, an unprecedented PMA value of 32 meV/u.c. (50.5 erg/cm$^2$) results. The resulting PMA magnitude of the described embodiments is over one order of magnitude larger than the PMA of Fe/MgO, which is in the approximate range of 1~2 meV/u.c.

TABLE I shows Bader charges on Fe and the top N atom. 'Bulk' refers to the bulk Fe and GaN, respectively. 'Surface' refers to the clean GaN (000$\bar{1}$) N-terminated surface, and 'interface' refers to 1 ML Fe on GaN. The last column gives the results with SOC included.

The giant PMA in Fe/GaN of the described embodiments cannot be explained by the second order perturbation of SOC. To explain the origin of this giant PMA, an analysis of the electronic structures of Fe(3d) orbitals are presented below.

Figure 2:
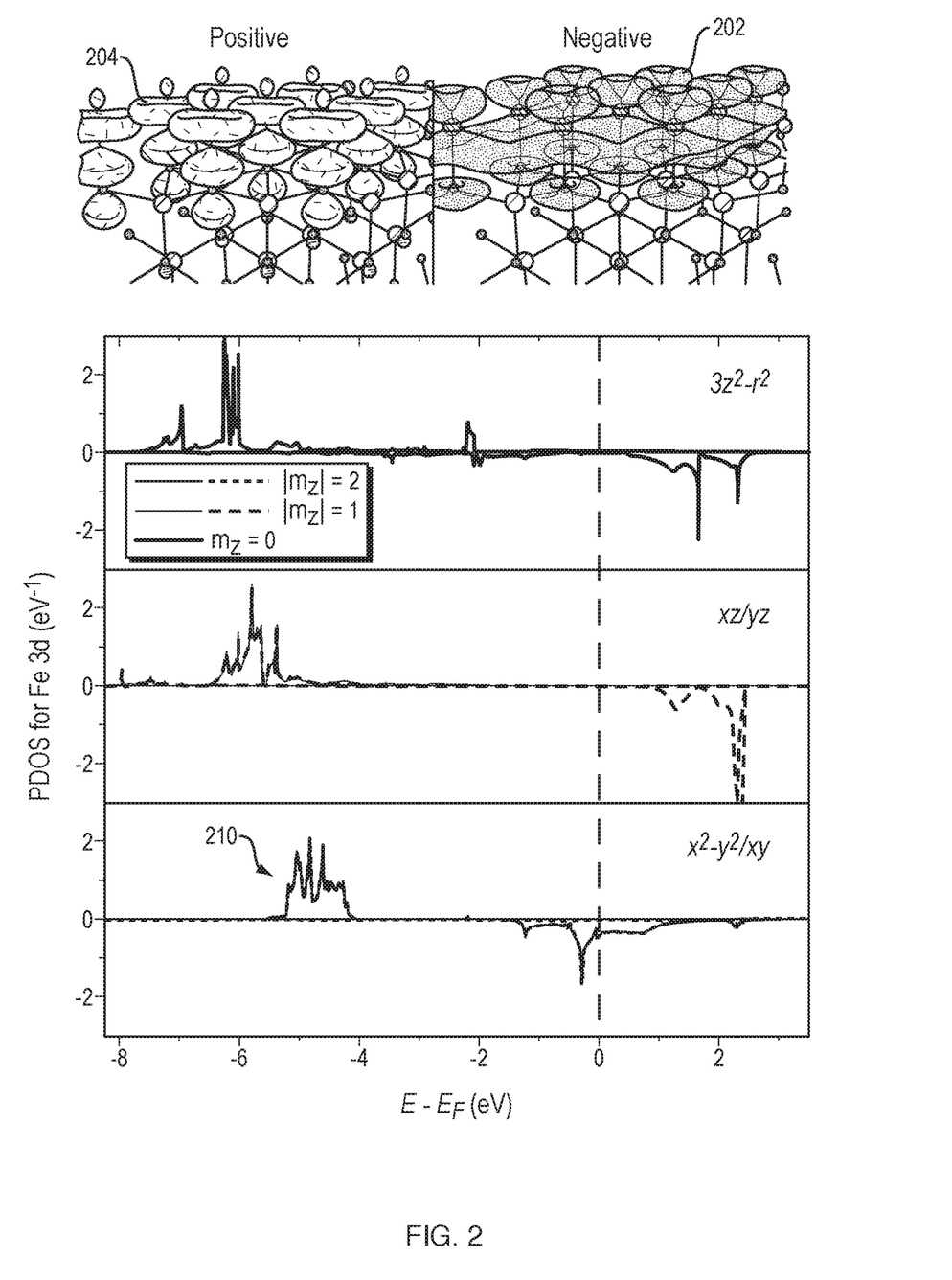
FIG. 2 illustrates the difference between total charge density of the Fe(1 ML)/GaN system of the described embodiments, and the sum of charge densities of a suspended 1 ML Fe and pure GaN supercell.

FIG. 2 illustrates the difference between total charge density of the Fe(1 ML)/GaN system of the described embodiments, and the sum of charge densities of a suspended 1 ML Fe and pure GaN supercell. Electron density is reduced in blue contours 202 while excessive in yellow contours 204. Charge transfer thus occurs from blue contour 202 to the yellow contour 204 during the formation of Fe—GaN interface. The yellow contour 204 indicates the formation of strong polarized Fe—N bonds and the enhancement of inplane $x^2-y^2$ and xy orbitals. From blue contours 202, a significant reduction of itinerant electrons and xz and yz orbitals, of Fe are witnessed. It is reasonable for itinerant electrons because Fe electrons saturate the dangling bonds from N atoms on N-terminated surface, so that Fe atoms lose electrons and become cations.

The ionic behaviors of Fe are double confirmed by the Bader charge results (see TABLE I), of which the difference corresponds to the charge increasing/decreasing on one atom. About 0.4 e⁻ electrons per Fe atom are transferred to N atoms on the interface. TABLE I shows Bader charges on Fe and the top N atom. 'Bulk' refers to the bulk Fe and GaN, respectively. 'Surface' refers to the clean GaN (000$\bar{1}$) N-terminated surface, and 'interface' refers to 1 ML Fe on GaN. The last column gives the results with SOC included. These interfacial N atoms thus have almost the same valence electrons as that in bulk GaN. Further, there is no additional inter-atomic charge transfer when SOC is included, shown on the last column in Table I.

TABLE I

| Bader charge | Bulk | Surface | Interface | Interface SOC |
| --- | --- | --- | --- | --- |
| Fe | 8.00 | — | 7.61 | 7.60 |
| N in GaN | 6.52 | 6.15 | 6.54 | 6.54 |

To explain the charge transfer from xz/yz to $x^2-y^2$/xy orbitals and thereby identify valence states of Fe cations, results of an investigation into the crystal field and orbital-resolved projected density-of-state (PDOS) of Fe(3d) without SOC first is presented. As shown in FIG. 2, all five d orbitals in the spin majority channel are far below the Fermi level and fully filled. Rich physics is present in the spin minority channel. Three orbitals, xz, yz and $3z^2-r^2$ are far above the Fermi surface and almost unoccupied. Importantly, partially filled $x^2-y^2$/xy orbitals cross the Fermi level. Two pairs of orbitals, xz/yz and $x^2-y^2$/xy, are both double degenerate, consistent with $C_{3v}$ point group of the crystal field around each Fe cation. These two degeneracies are protected by the two-dimensional irreducible representation E of $C_{3v}$. $x^2-y^2$/xy states are lower in energy than xy/yz. In reality, overlap between xz/yz and $x^2-y^2$/xy orbitals is present although it is small. According to the density matrix of Fe(3d) orbitals without SOC and the corresponding occupation number, $x^2-y^2$/xy-dominated lower energy states e are mixed with 3% xz/yz and xz/yz-dominated higher energy states e' contain 3% $x^2-y^2$/xy. In the spin minority channel, two e states have occupation number 0.457, that is, nearly half filled, while e' states are almost unoccupied with occupation number only 0.035. As a comparison, suspended 1 ML Fe has occupation number 0.095 for $x^2-y^2$/xy and 0.564 for xz/yz, so that $x^2-y^2$/xy orbitals are more occupied once Fe is deposited on GaN. It is consistent with the charge density contours discussed earlier. In general, the total magnetic moment of each Fe cation is 3.71 $\mu_B$, close to the magnetization mentioned earlier, so that it has a high spin state of S=2 with nearly half-occupied $x^2-y^2$/xy degenerate states in the spin minority channel.

Figure 3A:
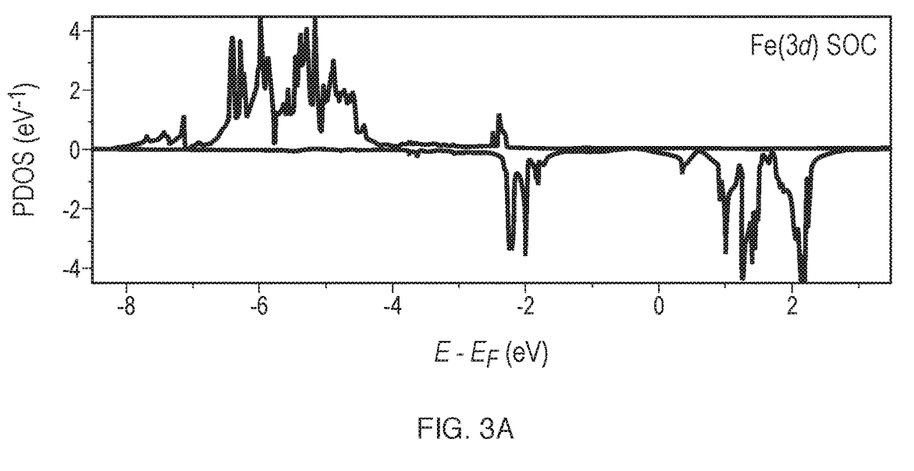
FIG. 3A illustrates projected density-of-state (PDOS) of Fe(3d) as a function of $E-E_F$.

Once SOC is included, one can expect the lift of degeneracy between $x^2-y^2$ and xy. It is confirmed by the PDOS shown in FIG. 3A, where almost no states are found near the Fermi level in the spin minority channel, and a large splitting (about 3.0 eV) appears, corresponding to the lift of $x^2-y^2$/xy degeneracy. The density matrix of Fe(3d) orbitals with SOC and their corresponding occupation number are presented in the Appendix I. The largest occupation number in spin minority channel is 0.904, and the corresponding eigenstate is $$\sqrt{\alpha}(i|xy\rangle + |x^2-y^2\rangle) + \sqrt{\beta}(i|xz\rangle - |yz\rangle)$$

or, equivalently, $$\sqrt{2\alpha}|Y_2^2\rangle + \sqrt{2\beta}|Y_2^1\rangle$$

where $\alpha$=0.458 and $\beta$=0.042. This nearly fully filled state is one branch of the original degenerate e states without SOC and predominated by $Y_2^2$. The other e state predominated by $Y_2^{-2}$ is hybrid with e' states and the occupation numbers for those three states are 0.042, 0.033 and 0.032 respectively, that is, almost empty. The $3z^2-r^2$ or $Y_2^0$-dominated state, which is insensitive to SOC, has the occupation number of 0.293. Therefore, the net orbital magnetic moment on Fe(3d) along z direction is 1.54 $\mu_B$, consistent with $L_z$=2 due to the splitting into $Y_2^2$ and $Y_2^{-2}$ in e states near the Fermi level. This result is demonstrated by FIG. 1B. With the occupation and orbital components derived, one can estimate the energy gain from SOC by the first order perturbation: $\Delta E$=0.904× $\lambda(2\times2\alpha+1\times2\beta)\approx$32.9 meV, where $\lambda\approx$19 meV is the SOC coefficient of Fe(3d). This energy gain matches well with the final PMA of 32 meV. Therefore, PMA in Fe/GaN thin films are dominated by the first order perturbation of SOC.

Large band splitting and the partial occupation in consequence are the precursor of large PMA according to the discussions above. However, one should note that the SOC of Fe(3d) is no larger than 20 meV, two orders of magnitudes smaller than the band width (~2.0 eV) of $x^2-y^2$/xy orbitals [see trace 210 of FIG. 2]. So, SOC alone can hardly generate such a large splitting of the entire band. By employing non-self-consistent calculations, we can obtain the PMA contributed by SOC alone, which is only 3.0 meV, a typical value for the second order correction. Since the spin splitting changes slightly after SOC is included and no structural reconstruction driven by SOC happens, SOC cannot be the major driving force of the band splitting. The only interaction on the scale of eV under investigation is the on-site electron-electron correlation interaction described by the Hubbard U. That indicates that the correlation interaction between occupied electrons must play a significant role on giant PMA of the described embodiments.

The energy contribution from Hubbard U can be given by the single-particle expression under the Dudarev formation of L(S)DA+U; $V_m^\sigma$=(U−J)(1/2−$n_m^\sigma$), where U−J=4.0 eV is the U value chosen for our first-principles calculations and $n_m^\sigma$ denotes the occupation number of orbital m in spin channel σ. The result is 1.62 eV for the $Y_2^2$-dominated state with occupation number 0.904, and 1.98 eV for three empty states, leading to a total splitting is 3.6 eV, consistent with the splitting in PDOS [see FIG. 3A] and exceeding the band width of the original $x^2-y^2$/xy. In addition, no band splitting takes place if SOC is turned off since two e and two e' states receive the same energy shift respectively from Hubbard U and acquire the same occupation number due to the degeneracy. Therefore, the band splitting is triggered by SOC, but amplified by the Hubbard U.

Figure 3B:
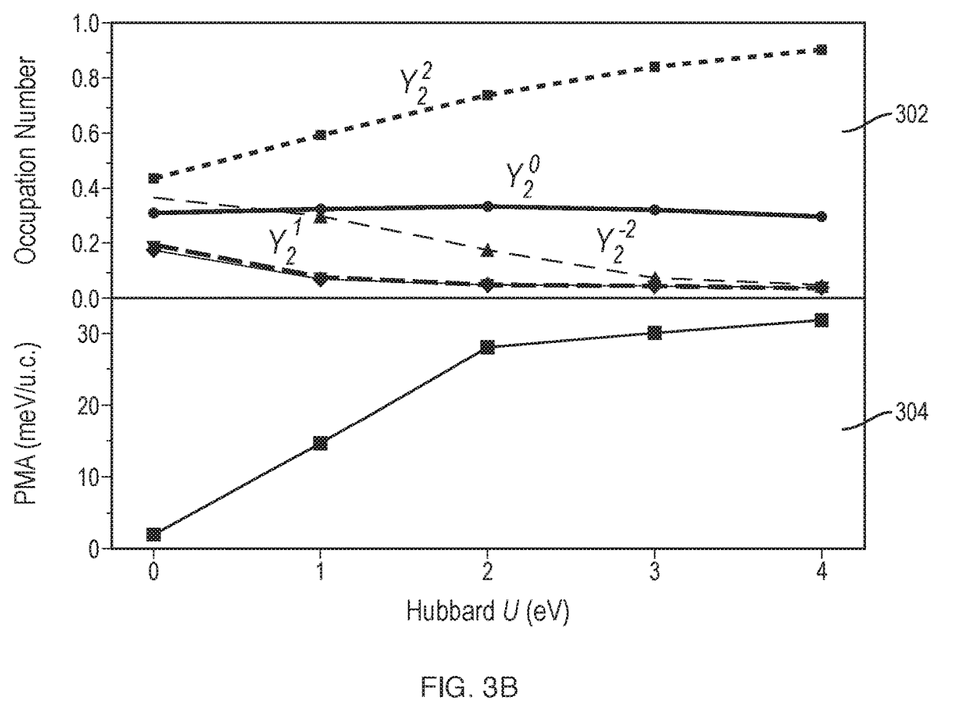
FIG. 3B shows the number of certain $Y_n^m$ occupied states as a function of Hubbard U, and PMA as a function of Hubbard U.

To further confirm this conclusion, we performed the SOC-included self-consistent calculations with multiple values of Hubbard U. As shown in the top portion 302 of FIG. 3B, the splitting between $Y_2^2$-dominated and $Y_2^{-2}$-dominated states is reduced when U decreases. The bottom portion 304 of FIG. 3B shows that PMA keeps a high value when U=2.0~4.0 eV, while PMA decreases swiftly around U=1.0 eV, which becomes smaller than the band width of the original $x^2-y^2$/xy. Eventually, when the Hubbard Uis zero, almost equal population of $x^2-y^2$ and xy states is recovered, and the magnitude of PMA is only 1.88 meV/u.c., which is entering the regime dominated by the second order correction of SOC. Thus, the Hubbard U plays a key role on the SOC-driven band splitting and the consequent large PMA in this thin film system.

Finally, we further investigated the thickness dependence of PMA in this system. Slab supercells with 2 ML and 3 ML Fe cations on top of GaN were built following the hexagonal closed packing along wurtzite GaN (000$\bar{1}$) direction. As a result, PMA for Fe(2 ML)/GaN and Fe(3 ML)/GaN are 37 meV/u.c. (58.4 erg/cm$^2$) and 21 meV/u.c. (33.2 erg/cm$^2$), respectively, which are still large enough to be considered in the first order SOC perturbation regime.

As a sided discovery, we found that in Fe(1 ML)/GaN thin film, the nearest neighbor Heisenberg exchange between Fe is in the plane and antiferromagnetic with a weak exchange coupling of J=0.8 meV. It might lead to spin frustration in this 2D hexagonal lattice. For Fe(2 ML)/GaN or Fe(3 ML)/GaN, however, the nearest neighbors of Fe are the interlayer instead, since the Fe—Fe distances between first-second, second-third and first-third layers are 2.444 Å, 2.385 Å, and 3.130 Å, respectively. All of them are smaller than intra-layer Fe—Fe distance of 3.183 Å. In the Fe(3 ML)/GaN thin film, the exchange couplings are −75 meV, −11 meV and −32 meV for first-second, second-third and first-third interlayer couplings, respectively, all ferromagnetic. The corresponding intra-layer exchanges are 14 meV, 13 meV and 2 meV for the first, second and top layers, respectively. Therefore, since the ferromagnetic coupling is much stronger than antiferromagnetic coupling, ferromagnetic films with giant PMA are identified.

In summary, based on non-collinear spin-polarized first-principles calculations, we discovered giant PMA in Fe/GaN thin films. For Fe(1 ML)/GaN film, we obtained a PMA of 32 meV/u.c. (50.5 erg/cm$^2$), which approaches the limit of the energy of SOC for an isolated Fe. Electronic structure calculations and ligand field analysis show that each Fe cation has a net orbital angular momentum $L_z$=2. It is originated from the SOC driven splitting of the degeneracy between $x^2-y^2$ and /xy orbitals. The on-site correlation interaction amplifies the splitting so that PMA is linearly proportional to the SOC. Thickness dependence shows that PMA is still large for multiple Fe layers deposited on GaN. Experimental results suggest that a Fe(1 ML)/GaN tiny square unit with only 2.0 nm in length has a total uniaxial magnetic anisotropy energy about 1.2 eV, reaching the criteria for 10-year data retention at room temperature. Therefore, giant PMA in this thin film can ultimately lead to nanomagnetism and promote revolutionary ultra-high storage density in the future.

Although the example embodiments described herein are directed to forming an N-terminated surface on a GaN substrate, it should be understood that other III-V nitride substrates may also be used. For example, Fe/InN has been shown to exhibit a PMA of 30.8 meV, and Fe/AlN has shown to exhibit a PMA of 60.1 meV.

The N-terminated surfaces associated with giant PMA materials of the described embodiments may be fabricated by growing, or otherwise procuring, a GaN substrate (or other III-V nitride), and exposing the GaN substrate under a nitrogen atmosphere. In one example embodiment, the substrate may be heated to about 1000° C. while exposed to a nitrogen plasma. After about 30 minutes under the nitrogen plasma, the temperature of the substrate may be reduced to about 685° C., initiating growth of the N-terminated surface. It should be understood that this example embodiment is not intended to be limiting, that other specific techniques known in the art may be employed for growth of the N-terminated surface described herein, and that the underlying requirement is the exposure of the substrate to a nitrogen atmosphere. In other embodiments, the N-terminated surface may be fabricated by exposing the nitride substrate to a NH$_3$ atmosphere, for example by sample annealing the substrate in a NH$_3$ atmosphere.

Figure 4:
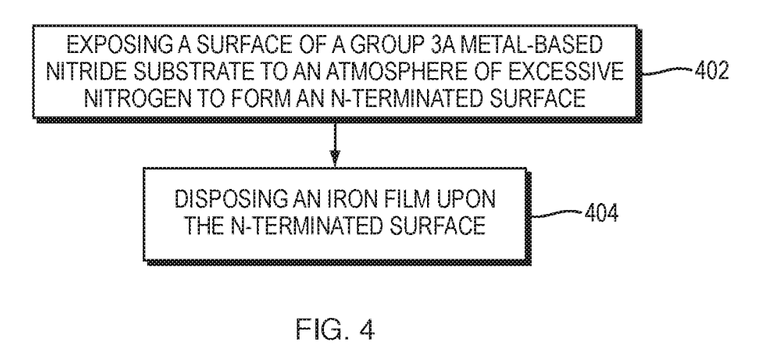
FIG. 4 illustrates a method of fabricating a giant PMA material according to the invention.

The exposure of the substrate to the nitrogen atmosphere may cause a monolayer of nitrogen atoms to form as the top surface of the GaN substrate. The monolayer of nitrogen atoms constitutes the N-terminated surface. FIG. 4 illustrates a method of fabricating a giant PMA material, comprising exposing 402 a surface of a III-V nitride substrate to an atmosphere of nitrogen to form an N-terminated surface, followed by disposing 404 an iron film upon the N-terminated surface.

Figure 5:
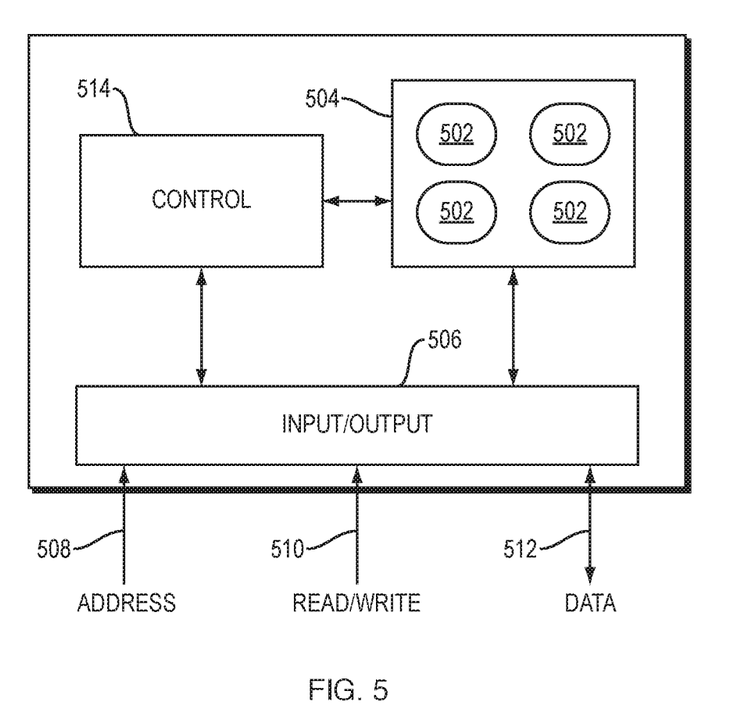
FIG. 5 illustrates an example of such a memory device 500 according to the invention.

The giant PMA materials according to the described embodiments may be used the underlying storage mechanism for data storage devices such as MRAM and hard disk memory devices. For examples of such storage devices, see "The emergence of spin electronics in data storage," C. Chappert, A. Fert, and F. N. Van Dau, Nat. Mater. 6, 813 (2007); "Current-induced torques in magnetic materials," A. Brataas, A. D. Kent, and H. Ohno, Nat. Mater. 11, 372 (2012); and "Perpendicular magnetic anisotropy at transition metal/oxide interfaces and applications," B. Dieny and M. Chshiev, Rev. Mod. Phys. 89, 025008, (2017). FIG. 5 illustrates an example of such a memory device 500 according to the invention. The memory device comprises a plurality of magnetic memory elements 502 constructed and arranged as is known in the art, each of the magnetic memory elements 502 being based on PMA material as described herein. The memory elements are arranged in an array 504. An input/output interface 506 transceives address signals 508, read/write signals 510 and data signals 512. A control element 514 coordinates reading data from, and writing data to, the memory elements 502.

While example embodiments have been particularly shown and described, it will be understood by those skilled in the art that various changes in form and details may be made therein without departing from the scope of the embodiments encompassed by the appended claims.

What is claimed is:

1. A giant perpendicular magnetic anisotropy (PMA) material, comprising:
   a III-V nitride substrate;
   a layer of nitrogen disposed upon a (000$\bar{1}$) surface of the III-V nitride substrate, the layer of nitrogen forming a (000$\bar{1}$) nitrogen terminated (N-terminated) surface; and
   an iron film disposed upon the (000$\bar{1}$) N-terminated surface.

2. The giant PMA material of claim 1, wherein the III-V nitride is gallium nitride (GaN).

3. The giant PMA material of claim 1, wherein the layer of nitrogen is a wurtzite GaN (000$\bar{1}$) N-terminated surface.

4. The giant PMA material of claim 1, wherein the layer of nitrogen is a monolayer of nitrogen atoms.

5. The giant PMA material of claim 1, wherein the iron film is less than or equal to three monolayers of iron atoms.

6. A method of fabricating a giant PMA material, comprising:
   exposing a (000$\bar{1}$) surface of a III-V nitride substrate to an atmosphere configured to provide a source of nitrogen, to dispose a layer of nitrogen on the (000$\bar{1}$) surface of the III-V nitride substrate, the layer of nitrogen forming an (000$\bar{1}$) N-terminated surface;
   disposing an iron film upon the (000$\bar{1}$) N-terminated surface.

7. The method of claim 6, wherein the atmosphere is configured to provide a source of nitrogen comprises an atmosphere of nitrogen.

8. The method of claim 6, wherein the atmosphere is configured to provide a source of nitrogen comprising an atmosphere of excessive $NH_3$.

9. The method of claim 8, further comprising sample annealing the III-V nitride substrate in the atmosphere of excessive $NH_3$.

10. The method of claim 6, further comprising heating III-V nitride substrate to a temperature of 1000° C., while exposing the III-V nitride substrate to a nitrogen plasma.

11. The method of claim 10, further comprising reducing the III-V nitride substrate to a temperature of 685° C., thereby initiating growth of the N-terminated surface.

12. The method of claim 6, wherein the III-V nitride is gallium nitride (GaN).

13. The method of claim 6, wherein the layer of nitrogen is a wurtzite GaN (000$\bar{1}$) N-terminated surface.

14. The method of claim 6, wherein the layer of nitrogen is a monolayer of nitrogen atoms.

15. The method of claim 6, wherein the iron film is less than or equal to three monolayers of iron atoms.

16. A memory device, comprising:
   a memory element comprising:
      a III-V nitride substrate;
      a layer of nitrogen disposed upon a (000$\bar{1}$) surface of the III-V nitride substrate, the layer of nitrogen forming an (000$\bar{1}$) N-terminated surface; and
      an iron film disposed upon the (000$\bar{1}$) N-terminated surface;
   an input/output interface configured to communicate an address signal, a read/write signal and a data signal; and
   a controller configured to coordinate reading data from and writing data to the memory element.

17. The memory device of claim 16, wherein the III-V nitride is gallium nitride (GaN).

18. The memory device of claim 16, wherein the layer of nitrogen is a wurtzite GaN (000$\bar{1}$) N-terminated surface.

19. The memory device of claim 16, wherein the layer of nitrogen is a monolayer of nitrogen atoms.

20. The memory device of claim 16, wherein the iron film is less than or equal to three monolayers of iron atoms.

* * * * *

UNITED STATES PATENT AND TRADEMARK OFFICE
CERTIFICATE OF CORRECTION

| | | |
|---|---|---|
| PATENT NO. | : 11,031,167 B2 | Page 1 of 1 |
| APPLICATION NO. | : 16/193929 | |
| DATED | : June 8, 2021 | |
| INVENTOR(S) | : Jiadong Zang and Jiexiang Yu | |

It is certified that error appears in the above-identified patent and that said Letters Patent is hereby corrected as shown below:

In the Specification

In Column 1, after the RELATED APPLICATION paragraph, at Line 11, please add:
--GOVERNMENT SUPPORT
This invention was made with government support under DE-SC0016424 awarded by the U.S. Department of Energy. The government has certain rights in the invention.--

Signed and Sealed this
Thirtieth Day of January, 2024

Katherine Kelly Vidal
*Director of the United States Patent and Trademark Office*